US005272027A

United States Patent [19]

Dillenbeck et al.

[11] Patent Number: 5,272,027

[45] Date of Patent: Dec. 21, 1993

[54] METHOD OF MONITORING THE PREPARATION OF A PHOTOGRAPHIC EMULSION BY CONDUCTIVITY MEASUREMENTS

[75] Inventors: Eric L. Dillenbeck, Rochester, N.Y.; Panayiota Panagiotidou, Victoria, Australia

[73] Assignee: Eastman Kodak Company, Rochester, N.Y.

[21] Appl. No.: 896,959

[22] Filed: Jun. 11, 1992

[51] Int. Cl.[5] ........................ G03C 5/00; G01N 27/04; G01R 27/22

[52] U.S. Cl. ...................................... 430/30; 324/439; 324/693; 324/722; 430/569

[58] Field of Search ............... 324/439, 654, 691, 693, 324/722; 430/30, 569; 204/153.13

[56] References Cited

U.S. PATENT DOCUMENTS 1,450,023 3/1923 Edelman .
1,951,035 3/1934 Parker .
2,068,499 1/1937 Mackenzie .
2,571,791 10/1951 Tompkins .
3,049,410 8/1962 Warfield et al. .
3,278,844 10/1966 Bell et al. .
3,281,681 10/1966 Stevenson .
3,657,640 4/1972 Jelinek et al. .
3,868,315 2/1975 Forster et al. .
4,196,385 4/1980 Vestergaard et al. .
4,524,319 6/1985 Eberling et al. .

FOREIGN PATENT DOCUMENTS 4744487 11/1972 Japan .................................... 430/30

OTHER PUBLICATIONS

E. Punger, "Oscillometry and Conductivity", Pergamon Press, 1965, pp. XV, 202-203 and 209.
I. Kolthoff and P. Elving, "Treatise on Analytical Chemistry", Part I, vol. 4, Interscience Publishers, pp. 2624, 2626-2627.
H. Strobel, "Chemical Instrumentation", Addison Wesley Publishing Co., Reading, MA., 1972, pp. 763-783.
A. Weissberger, "Physical Methods of Organic Chemistry", 3rd Edition, Interscience Publishers, New York, 1960, pp. 3011-3046, and p. 3088.

*Primary Examiner*—Gerard R. Strecker
*Assistant Examiner*—Diep Do
*Attorney, Agent, or Firm*—Carl F. Ruoff

[57] ABSTRACT

While preparing a photographic emulsion a conductivity reading is continuously or periodically taken from the batch during creation. The conductivity of the batch is compared to a standard plot of conductivity versus time representing an ideal batch preparation process. When conductivity of the batch deviates from the standard plot by more than a pre-determined level, an operator can discard the batch, compensate for the deviations, identify the cause of the deviation for use in correcting existing processes and procedures or optimizing future procedures, or compensate for the deviations.

7 Claims, 2 Drawing Sheets

METHOD OF MONITORING THE PREPARATION OF A PHOTOGRAPHIC EMULSION BY CONDUCTIVITY MEASUREMENTS

BACKGROUND OF THE INVENTION

The present invention relates to the preparation of photographic emulsions, and more particularly, to a method which includes the monitoring of such preparations.

Photographic emulsions are prepared by adding to a dispersion of silver halide in gelatin various addenda such as spectral sensitizing dyes, antifoggants, grain growth modifying agents, additional silver halide and the like.

The batch-wise preparation of photographic emulsions is conventionally conducted manually by an operator who performs each step in the process by referring to a script. That is, the operator adds constituents in an amount and at a time called for by a formula. In order to make batches having the same photographic properties each batch must be prepared in the same way. The conventional procedure, however is susceptible to error. For instance, an operator may reverse the addition sequence, add constituents later in time than called for or fail to add the proper amount of a required constituent. The emulsion batch will then be different from other batches.

Without a monitoring mechanism, such errors can go undetected until after completion of the emulsion. Delaying discovery of error until this late stage wastes time and chemicals. The early discovery of an error would allow the operator immediately to abort the process. Heretofore, no suitable quantitative measure of the accuracy of the emulsion preparation process has existed.

It is known to use conductivity or resistivity measurements to determine the end point of a reaction or titration. Typical is U.S. Pat. No. 2,571,791 to Tompkins; U.S. Pat. No. 3,049,410 to Warfield et al.; U.S. Pat. No. 3,868,315 to Forster et al.; and U.S. Pat. No. 1,450,023 to Edelman. It is also known to monitor conductivity or resistivity as a function of temperature during a process to detect and control changes. This procedure is described in U.S. Pat. No. 3,278,844 to Bell et al.; U.S. Pat. No. 3,281,681 to Stevenson; and U.S. Pat. No. 3,657,640 to Jelinek et al. Conductivity has also been used for the determination of the kinetics of structure formation in binders. See U.S. Pat. No. 4,524,319 to Eberling et al. Eberling does not contemplate the addition of chemical components during the monitoring period, however. It is also known to measure conductivity of a solution and compare the conductivity reading to a conductivity taken simultaneously from a standard solution for control purposes, as shown in U.S. Pat. No. 1,951,035 to Parker. It is also known to measure changes of concentrations of fluid by measuring changes in the dielectric constant of the surrounding fluid and comparing it with pre-programmed desired levels. See U.S. Pat. No. 4,196,385 to Vestergaard et al. None of these references, however, teaches a suitable method for monitoring the preparation of a photographic emulsion so that errors in the process can be identified instantaneously.

SUMMARY OF THE INVENTION

The method of the present invention for preparing a photographic emulsion to obtain a desired product comprises preparing a series of photographic emulsions, each of which is prepared by adding the same quantities of the same materials in the same sequence over the same period of time to a gelatin composition in a mixing vessel. During each preparation, the electrical conductivity of the contents of the mixing vessel is measured and plotted as electrical conductivity versus time. From this plot a standard plot is derived. Using the standard plot, a desired product emulsion composition with the same materials used in the previous batch is prepared by adding materials sequentially over a period of time to a gelatin composition in a mixing vessel. The conductivity of the desired product emulsion composition is measured during this period of time and the measurements are plotted as conductivity versus time. Finally, the plotted measurements of the desired product emulsions are compared with the standard plot during the preparation of the desired product, and deviations are identified.

BRIEF DESCRIPTION OF THE DRAWINGS

The invention will be further illustrated by reference to the drawings, of which.

DESCRIPTION OF THE PREFERRED EMBODIMENT

Figure 1:
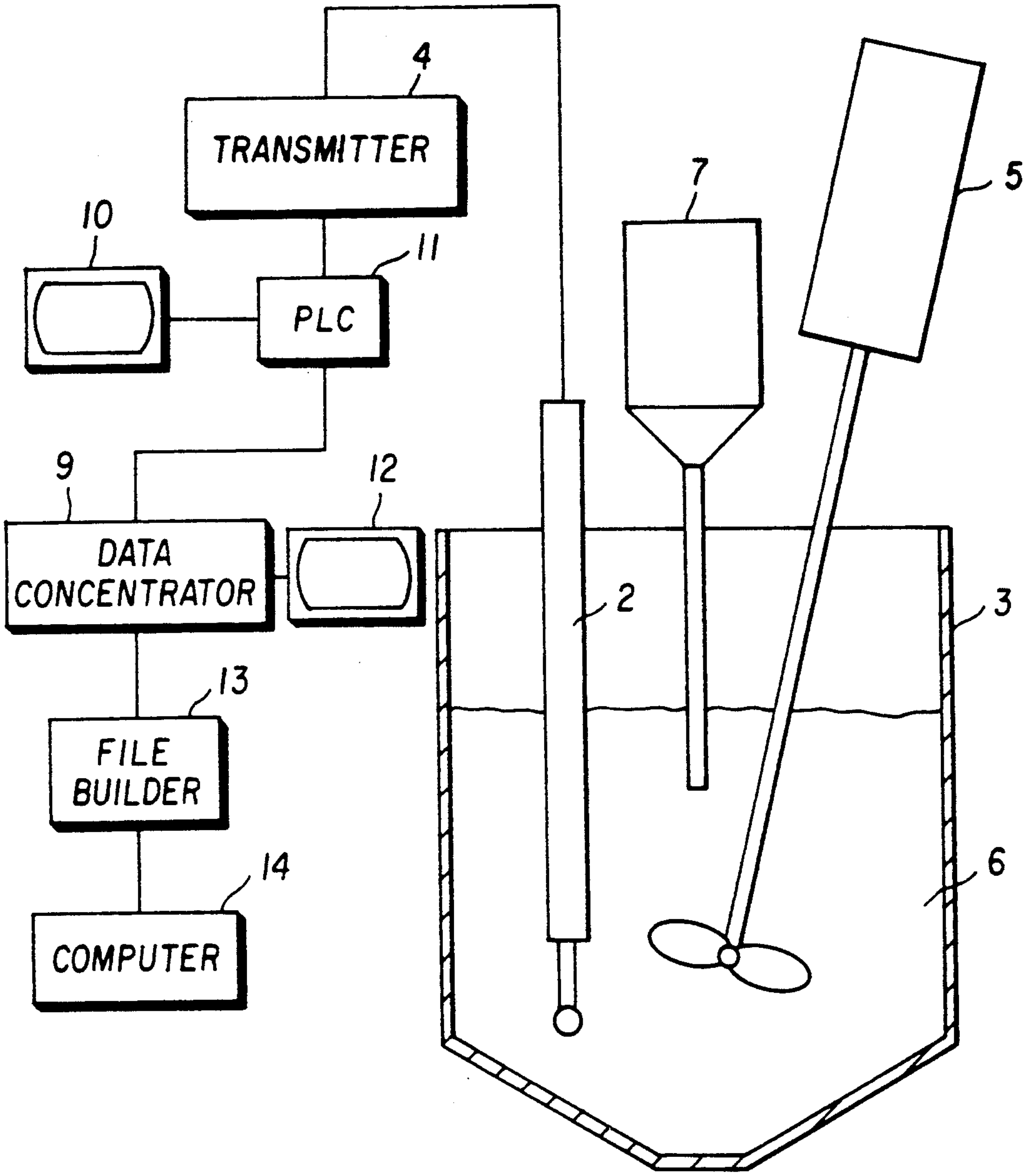
FIG. 1 is a block diagram depicting the apparatus for measuring the conductivity of a batch.

Referring more particularly to the drawings, FIG. 1 shows a block diagram of the apparatus used to monitor a mixture of photographic emulsion materials as a batch is prepared. Constituents are added on schedule through a dispenser 7, which is depicted as a funnel-type apparatus in FIG. 1, but which can be any type of conduit capable of delivering liquids. The batch is stirred on schedule by mixer 5.

Conductivity probe 2 is immersed in the mixture in a kettle 3 and senses the conductivity of the batch 6 continuously during the addition process. Probe 2 preferrably is of the "electrodeless" variety, i.e., of the type employing a pair of toroidal electrodes isolated from the solution to be measured. The preferred conductivity probe is a Foxboro Electrodeless Conductivity Probe, Model No. 871EC-LP, but any probe capable of detecting conductivity and producing a corresponding electrical signal can be used. An electrodeless probe is preferred because it is more rugged, easier to clean, and less prone to drift than contacting-type conductivity probes. To sense conductivity, a first toroidal electrode receives an AC signal from transmitter 4. The first toroid induces AC current in the second toroidal electrode through the fluid surrounding the probe. This induced current is then applied to transmitter 4. Transmitter 4 compares the signal sent to the first toroidal electrode with the signal received from the second toroidal electrode and generates a signal proportional to the conductivity of the solution surrounding the probe. The transmitter 4 preferably is a Foxboro Electrodeless Conductivity Transmitter, Model No. 870 or 872. However any transmitter capable of generating signals proportional to measured conductivity can be used.

Output signals from the transmitter 4 are then applied to a programmable logic controller (PLC) 11. PLC 11 samples signals from transmitter 4, preferably at one second intervals, and calculates the average conductivity value over a preselected time period, preferrably ten seconds. From this ten-second average, the PLC 11 can also calculate a delta conductivity value, which is the change in average conductivity in consecutive ten second sample periods. A first monitor 10, which can be a CRT or any other suitable display device, can display the ten-second average and delta conductivity values in tabular form in real time. PLC 11 preferrably is a PLC-560 programmable logic controller manufactured by Allen/Bradley.

PLC 11 also applies an analog signal representing batch conductivity to a data concentrator 9, which also preferrably is an Allen/Bradley PLC-560. Data concentrator 9 can receive conductivity signals representing a plurality of different batch preparations being performed simultaneously. Each of the preparations has associated with it its own PLC 11. The data concentrator 9 organizes the data from each preparation into discrete data files. These data files can then be manipulated by the data concentrator 9 to yield average conductivity and delta conductivity values for each batch preparation process. The results of these manipulations can be displayed graphically on a second monitor 12.

The data files compiled by the data concentrator 9 are then sent to a file builder 13 where the data for each batch is stored in a file along with information identifying the batch, the conditions under which it was prepared, the time and date of preparation, etc. The files built by the file builder 13 are formatted so as to be useable by a data analysis software package. The file builder 13 preferrably is a Pyramid Integrator made by Allen/Bradley.

The data files compiled by the file builder 13 are sent to a computer 14 where they can be analyzed. Computer 14 preferrably is a VAX made by Digital Equipment Corporation. Using data analysis software which can compute an average conductivity profile of a plurality of different batch preparation sequences, computer 14 can produce a standard plot of a desirable batch preparation process. The standard plot can either be graphical or tabular in form.

The standard plot is created by first preparing a series of replicated (i.e., prepared by adding the same quantities of the same materials in the same sequence over the same period of time) photographic emulsion batches. Using only replicated batches of suitable quality, an average conductivity value for corresponding events in the replicated processes is used to compute a standard conductivity plot. The standard plot represents the average conductivity value at corresponding times in each of the replicated batches of suitable quality. In the preferred embodiment of the present invention, the conductivity values of forty replicated batches of suitable quality are used to create the standard plot. As materials are added, the measured conductivity can change because of ionic complexing, ion reequilibration, or dilution. A unique conductivity versus time relationship exists for the composition of starting materials, order of addition of constituent materials, hold times between additions, completeness of the addition process, method of dispersal of addenda, type and amount of materials added, and rate of addition of materials. Since conductivity is also affected by temperature and viscosity, this monitoring technique can be used to monitor processes involving temperature and viscosity changes.

The profile can be useful in two different ways. First, a tabular profile can be used as a quality control check by an operator while he prepares a batch. Specifically, the operator can compare average conductivity and delta conductivity values plotted and displayed in real time on first monitor 10 for the batch he is preparing (which is a batch containing the same quantity of the same materials added in the same sequence over the same period of time to a gelatin composition in a mixing vessel) with the conductivity values listed in the standard plot for corresponding times. If the observed conductivity values deviate from the expected values by at least three standard deviations, the operator can identify the deviations and discard the batch or take appropriate corrective action if possible. Alternatively, the profile can be stored in memory and used to automatically generate a warning signal to alert the operator if the conductivity of the batch he is preparing deviates from the expected value by more than three standard deviations. The latter use of the profile can be carried out in a computer using a program which can compare stored, expected conductivity values from the standard plot with average and delta conductivity values generated by PLC 11 for the batch being prepared.

In another embodiment of the present invention, a method is provided for graphically determining the quality of a batch-produced photographic emulsion. While the photographic materials are being mixed, conductivity in the mixing vessel is monitored continuously. The conductivity measurements can be used to create a plot of conductivity versus time, as discussed previously, which can be stored in memory and/or be displayed in tabular form on a a first monitor 10. Because the plot can reflect changes in conductivity due to the addition and heating of photographic materials, the plot provides a graphical representation of the steps taken in the production of the emulsion. Such a representation is useful, for instance, in the test production of emulsions, where a series of plots can provide graphical records of each experimental production sequence.

EXAMPLE

Figure 2:
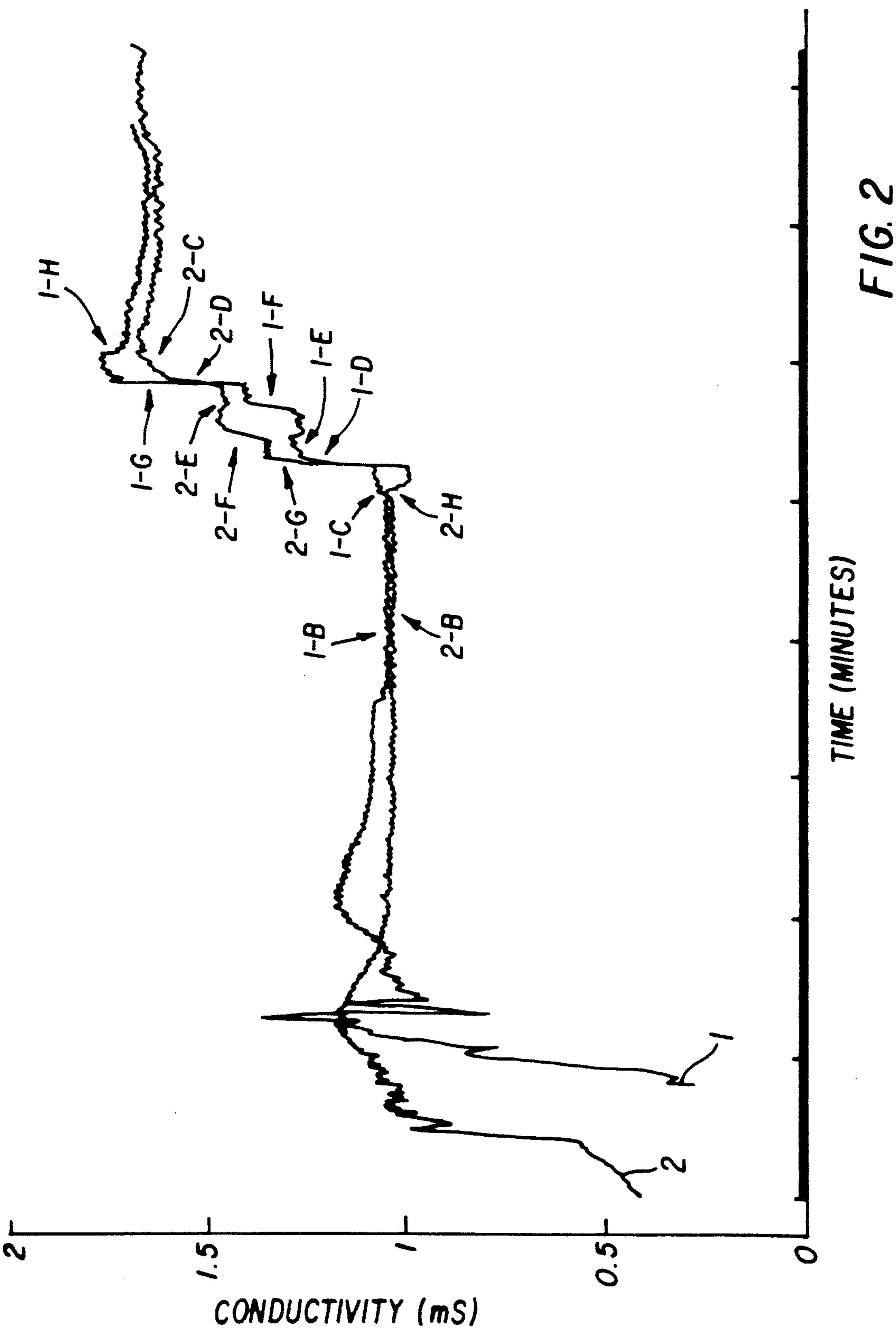
FIG. 2 depicts plots of a standard batch preparation procedure and an inaccurately performed procedure overlaid to highlight differences in conductivity at various points in time.

FIG. 2 shows how the method of continuously monitoring the conductivity of a batch of photographic emulsion materials during the preparation thereof can be used to identify incorrectly performed procedural steps. Plot 1 of FIG. 2 is the standard plot of conductivity versus time for the preparation of a series of photographic emulsion batches of suitable quality. Each letter following the prefix "1" or "2" indicates the addition of a different material during the respective runs. Use of the same letter in plots 1 and 2 indicates use of the same material. The process is conducted as follows.

Initially, an aqueous gelatin suspension is added to a kettle and liquefied by heating for 20 minutes at a temperature of approximately 46° C. When liquefaction is achieved, conductivity reaches a constant level, 1-B. Emulsion addenda are then added sequentially as indicated at points 1-C through 1-H. These points represent addition of measured amounts of the various emulsion addenda such as antifoggants, sequestrants, pH adjust addenda, surfactants and dyes. The addition of each material can be seen by sudden changes in conductivity at the points corresponding to each reference numeral.

Plot 2 of FIG. 2 shows a conductivity versus time profile representing the creation of a second batch of photographic emulsions. In the second batch, a different order of addition of certain constituents was used. It can be seen clearly, from the differences in the two plots, where the procedure used in plot 1 was deviated from in plot 2. For example, rather than adding material C, the procedure in plot 2 added material H. Compare the conductivity changes at points 1-C and 2-H. Deviations of more than three standard deviations in the conductivity level for a given material can trigger an alarm signal to alert the operator that an error in the process has occurred. Alternatively, if the conductivity data are displayed on a monitor, the operator can look for deviations and act appropriately if action is necessary.

The invention has been described in detail with particular reference to the preferred embodiment thereof, but it will be understood that the variations and modifications can be effected within the spirit and scope of the invention.

We claim:

1. A method of preparing a photographic emulsion to obtain a desired product emulsion which comprises:
   - preparing a series of replicated photographic emulsion batches, each of which is prepared by adding the same quantities of the same materials in the same sequence over the same period of time to a gelatin composition in a mixing vessel;
   - measuring the electrical conductivity of the contents of the mixing vessel during the preparation of each batch and plotting the measurements as electrical conductivity versus time;
   - deriving from the plots for said replicated batches a standard plot;
   - preparing a desired product emulsion with the same materials as for said replicated batches by adding said materials sequentially over said period of time to a gelatin composition in a mixing vessel;
   - measuring the conductivity of the contents of the mixing vessel during the preparation of said desired product emulsion and plotting the measurements as conductivity versus time;
   - comparing the plot of conductivity versus time during the preparation of said desired product emulsion with said standard plot; and
   - identifying deviations in the measured conductivity values of the plot for said desired product emulsion from the expected conductivity values of said standard plot.

2. The method according to claim 1, further comprising selecting from said series of emulsion batches one or more batches of desired quality for deriving said standard plot.

3. The method according to claim 1 further comprising adjusting the conditions of preparation of said desired product emulsion composition in response to said deviations.

4. The method according to claim 2 wherein said measuring of the electrical conductivity comprises
   - inserting a conductivity probe into said mixing vessel; and
   - generating an electrical signal proportional to said electrical conductivity as sensed by said probe.

5. The method according to claim 3, wherein the measuring of the electrical conductivity comprises
   - inserting a conductivity probe into said mixing vessel; and
   - generating an electrical signal proportional to said electrical conductivity as sensed by said probe.

6. The method according to claim 2 which further comprises selecting batches having a conductivity versus time plot wherein the conductivity value at any given time varies from that of said standard plot by no more than three standard deviations.

7. A method for monitoring the conditions of preparation of a photographic emulsion to obtain a desired product which comprises:
   - preparing a photographic emulsion batch by adding photographic materials sequentially over a period of time to a gelatin composition in a mixing vessel;
   - measuring the electrical conductivity of the contents of said mixing vessel during the preparation of said batch; and
   - plotting the measurements as electrical conductivity versus time, whereby said plot of electrical conductivity versus time provides a graphical representation of the quality of said batch.

* * * * *